United States Patent
Ezaki et al.

(10) Patent No.: US 7,808,813 B2
(45) Date of Patent: Oct. 5, 2010

(54) MAGNETIC MEMORY CELL READING APPARATUS

(75) Inventors: Joichiro Ezaki, Tokyo (JP); Yuji Kakinuma, Tokyo (JP)

(73) Assignee: TDK Corporation, Tokyo (JP)

( * ) Notice: Subject to any disclaimer, the term of this patent is extended or adjusted under 35 U.S.C. 154(b) by 765 days.

(21) Appl. No.: 11/721,141

(22) PCT Filed: Dec. 7, 2005

(86) PCT No.: PCT/JP2005/022425
§ 371 (c)(1),
(2), (4) Date: Jun. 7, 2007

(87) PCT Pub. No.: WO2006/062113
PCT Pub. Date: Jun. 15, 2006

(65) Prior Publication Data
US 2009/0290405 A1      Nov. 26, 2009

(30) Foreign Application Priority Data
Dec. 8, 2004    (JP) .............................. 2004-355507

(51) Int. Cl.
  *G11C 11/00*   (2006.01)
(52) U.S. Cl. ....................... 365/158; 365/171
(58) Field of Classification Search .................. 365/158, 365/171, 173, 207
See application file for complete search history.

(56) References Cited

U.S. PATENT DOCUMENTS 6,151,261 A    11/2000  Sato
6,738,285 B2 * 5/2004  Tanizaki et al. ............. 365/158
6,775,195 B1 * 8/2004  Theel ........................ 365/158
6,996,001 B2   2/2006  Ezaki et al.
7,209,380 B2   4/2007  Ezaki et al.
7,227,771 B2   6/2007  Ezaki et al.
2004/0066678 A1* 4/2004  Oh et al. ..................... 365/200

(Continued)

FOREIGN PATENT DOCUMENTS

JP      1-149291      6/1989

(Continued)

OTHER PUBLICATIONS

English language Abstract of JP 1-149291.
English language Abstract of JP 2004-280910.
English language Abstract of JP 11-007778.
English language Abstract of JP 2004-178623.

*Primary Examiner*—Son Dinh
(74) *Attorney, Agent, or Firm*—Greenblum & Bernstein, P.L.C.

(57) ABSTRACT

There is provided a magnetic memory device capable of reading information even with a lower power supply voltage.

The magnetic memory device is equipped with a plurality of storage cells laid out in two dimensions in (i+1) rows and (j+1) columns (where i, j are integers of one or higher). Two magnetoresistive effect revealing bodies $2a$, $2b$ are disposed in each of the storage cells 1, and each storage cell includes: a first stage circuit 41 that supplies currents $Ib1$, $Ib2$ for detecting resistances of magnetoresistive effect revealing bodies $2a$, $2b$; an X-direction address decoder circuit 32 that supplies currents $Iw1$, $Iw2$ to the magnetoresistive effect revealing bodies $2a$, $2b$; and a current control circuit (constant current circuit $25n$) that carries out control so that the total of the current $Ib1$ and the current $Iw1$ and the total of the current $Iw2$ and the current $Ib2$ are respectively constant.

9 Claims, 2 Drawing Sheets

U.S. PATENT DOCUMENTS

| | | |
|---|---|---|
| 2006/0239065 A1 | 10/2006 | Ezaki et al. |
| 2006/0279980 A1 | 12/2006 | Haratani et al. |
| 2007/0019464 A1 | 1/2007 | Ezaki et al. |

FOREIGN PATENT DOCUMENTS

| | | |
|---|---|---|
| JP | 11-007778 | 1/1999 |
| JP | 2004-178623 | 6/2004 |
| JP | 2004-280910 | 10/2004 |
| WO | 2004/081943 | 9/2004 |

* cited by examiner

MAGNETIC MEMORY CELL READING APPARATUS

TECHNICAL FIELD

The present invention relates to a magnetic memory device that is equipped with storage cells including magnetoresistive effect revealing bodies and is constructed so as to be capable of recording and reading information.

BACKGROUND ART

One example of this type of magnetic memory device is the magnetic memory device disclosed by the present applicant in Japanese Laid-Open Patent Publication No. 2004-178623. This magnetic memory device is a magnetic random access memory (MRAM) and is constructed by laying out a plurality of storage cells, which are each equipped with a pair of magnetoresistive effect elements and a pair of backflow preventing diodes, in two dimensions. Binary information is stored in each storage cell by setting the resistance of one of the magnetoresistive effect elements higher than the resistance of the other magnetoresistive effect element.

With this magnetic memory device, when the information stored in one out of the plurality of storage cells is read out, a pair of transistors (column selecting transistors) are driven via a Y-direction address decoder shown in FIG. 9 of the publication so that current can be supplied via current/voltage converting resistors to a pair of sense bit lines (current supplying lines) that are connected to the respective emitter terminals of the column selecting transistors. Also, by driving one constant current circuit via an X-direction address decoder, it is possible to produce a state where a constant current can be drawn from the storage cells connected to one sense word line (a current drawing line) connected to the constant current circuit. By doing so, the storage cell that is disposed at an intersection of the pair of current supplying lines and the current drawing line and is connected to both types of lines is selected, and currents in proportion to the resistances of the respective magnetoresistive effect elements respectively flow in a first circuit from a power supply to ground via one of the current/voltage converting resistors, one of the column selecting transistors, one of the magnetoresistive effect elements included in the selected storage cell, one of the backflow preventing diodes, and a constant current circuit and in a second circuit from the power supply to ground via the other current/voltage converting resistor, the other column selecting transistor, the other magnetoresistive effect element included in the selected storage cell, the other backflow preventing diode, and the constant current circuit. Voltages that are proportionate to the currents flowing in the respective circuits are generated across both ends of the respective current/voltage converting resistors disposed in the circuits. Accordingly, by detecting the voltages generated across the respective current/voltage converting resistors (or the difference between such voltages), it is possible to detect the relative magnitudes of the resistances of the magnetoresistive effect elements included in the selected cell and to thereby read the information stored in such storage cell.

Patent Document 1

Japanese Laid-Open Patent Publication No. 2004-178623

DISCLOSURE OF THE INVENTION

Problem to be Solved by the Invention

By further investigating the conventional magnetic memory device described above, the present inventors found the following issues to be improved. With the above magnetic memory device, when information stored in a storage cell is read, a current is supplied to each circuit from the power supply to ground via a current/voltage converting resistor, a column selecting transistor, a magnetoresistive effect element, and a constant current circuit. However, since a construction is used where a magnetoresistive effect element that constructs a storage cell and one of the backflow preventing diodes are disposed in series in each circuit, a high power supply voltage is required to cause a sufficiently large current to flow in each circuit. Accordingly, since a high power supply voltage is required for this magnetic memory device, there are issues of an increase in power consumption and of difficulty in operating the device by batteries.

The present invention was conceived in view of the issues described above and it is a principal object of the present invention to provide a magnetic memory device that can read information even when a lower power supply voltage is used.

Means for Solving the Problem

A magnetic memory device according to the present invention includes a plurality of storage cells laid out in two dimensions in (i+1) rows and (j+1) columns (where i, j are integers of one or higher), wherein one or two or more magnetoresistive effect revealing bodies are disposed in each of the storage cells, and the magnetic memory device further includes: a first current supplying circuit that supplies a first current for detecting a resistance of each magnetoresistive effect revealing body; a second current supplying circuit that supplies a second current to each magnetoresistive effect revealing body; and a current control circuit that carries out control so that a total of the first current and the second current is constant.

Here, two magnetoresistive effect revealing bodies may be disposed in each of the storage cells, one current control circuit may be connected to both magnetoresistive effect revealing bodies in each storage cell, the first current supplying circuit may include two detection resistors that convert first currents to detection voltages, the second current supplying circuit may supply second currents to both magnetoresistive effect revealing bodies, and each current control circuit may carry out control so that each total produced by adding a first current flowing through a detection resistor and a second current flowing through a magnetoresistive effect revealing body is constant.

The magnetic memory device may further include a differential amplifier circuit that operates based on a voltage difference between the detection voltages converted by the respective detection resistors to read information stored in each storage cell.

One magnetoresistive effect revealing body may be disposed in each of the storage cells, the current control circuit may be connected to the magnetoresistive effect revealing body in each storage cell, the first current supplying circuit may include a detection resistor that converts the first current to a detection voltage, and the second current supplying circuit may supply the second current to the magnetoresistive effect revealing body.

The magnetic memory device may further include a differential amplifier circuit that operates based on a voltage difference between the detection voltage converted by the detection resistor and a reference voltage to read information stored in each storage cell.

A resistance of the detection resistor may be set at least double a resistance of each magnetoresistive effect revealing body.

EFFECT OF THE INVENTION

According to a magnetic memory device according to the present invention, by including a first current supplying circuit that supplies a first current for detecting a resistance of each magnetoresistive effect revealing body, a second current supplying circuit that supplies a second current to each magnetoresistive effect revealing body, and a current control circuit that carries out control so that a total of the first current and the second current is constant, it is possible to achieve a construction where the first current supplying circuit and the storage cell (magnetoresistive effect revealing body) are connected in parallel to the current control circuit. This means that compared to a conventional construction where the first current supplying circuit, the storage cell, and the current control circuit are connected in series between a DC voltage and ground, it is possible to lower the voltage required by a series circuit composed of the first current supplying circuit and the current control circuit by the voltage drop across the storage cell. Accordingly, since it is possible to supply first currents of a sufficient magnitude even when the DC voltage is reduced, it is possible to reduce the power consumption while still being able to carry out stabilized read operations.

Also, according to a magnetic memory device according to the present invention, by disposing two magnetoresistive effect revealing bodies in each of the storage cells, connecting one current control circuit to both magnetoresistive effect revealing bodies in each storage cell, equipping the first current supplying circuit with two detection resistors that convert first currents to detection voltages, having the second current supplying circuit supply the second current to both magnetoresistive effect revealing bodies, and having each current control circuit carry out control so that each total produced by adding a first current flowing through a detection resistor and a second current flowing through a magnetoresistive effect revealing body is constant, it is possible to achieve a construction where the first current supplying circuit and the storage cell (magnetoresistive effect revealing body) are connected in parallel to each current control circuit. This means that compared to a conventional construction where the first current supplying circuit, the storage cell, and the current control circuit are connected in series between a DC voltage and ground, it is possible to lower the voltage required by a series circuit composed of the first current supplying circuit and the current control circuit by the voltage drop across the storage cell. Accordingly, since it is possible to supply first currents of a sufficient magnitude even when the DC voltage is reduced, it is possible to reduce the power consumption while still being able to carry out stabilized read operations.

In addition, according to a magnetic memory device according to the present invention, by having a differential amplifier circuit operate based on a voltage difference between the detection voltages converted by the respective detection resistors to read information stored in each storage cell and setting a resistance of each detection resistor higher than a resistance of each magnetoresistive effect revealing body, it is possible to sufficiently raise the sensitivity when reading information from a storage cell.

Also, according to a magnetic memory device according to the present invention, by disposing one magnetoresistive effect revealing body in each of the storage cells, connecting the current control circuit to the magnetoresistive effect revealing body in each storage cell, equipping the first current supplying circuit with a detection resistor that converts the first current to a detection voltage, and having the second current supplying circuit supply the second current to the magnetoresistive effect revealing body, it is possible to achieve a construction where the first current supplying circuit and the storage cell (magnetoresistive effect revealing body) are connected in parallel to each current control circuit. This means that compared to a conventional construction where the first current supplying circuit, the storage cell, and the current control circuit are connected in series between a DC voltage and ground, it is possible to lower the voltage required by a series circuit composed of the first current supplying circuit and the current control circuit by the voltage drop across the storage cell. Accordingly, since it is possible to supply a first current of a sufficient magnitude even when the DC voltage is reduced, it is possible to reduce the power consumption while still being able to carry out stabilized read operations.

In addition, according to a magnetic memory device according to the present invention, by having a differential amplifier circuit operate based on a voltage difference between the detection voltage converted by the detection resistor and a reference voltage to read information stored in each storage cell and setting a resistance of the detection resistor higher than a resistance of the magnetoresistive effect revealing body, it is possible to sufficiently raise the sensitivity when reading information from a storage cell.

Also, according to a magnetic memory device according to the present invention, by setting a resistance of the detection resistor at least double a resistance of each magnetoresistive effect revealing body, it is possible to significantly raise the sensitivity when reading information from a storage cell.

BEST MODE FOR CARRYING OUT THE INVENTION

Preferred embodiments of a magnetic memory device according to the present invention will now be described with reference to the attached drawings.

First, the construction of a magnetic memory device M according to the present invention will be described with reference to FIGS. 1 and 2.

Figure 1:
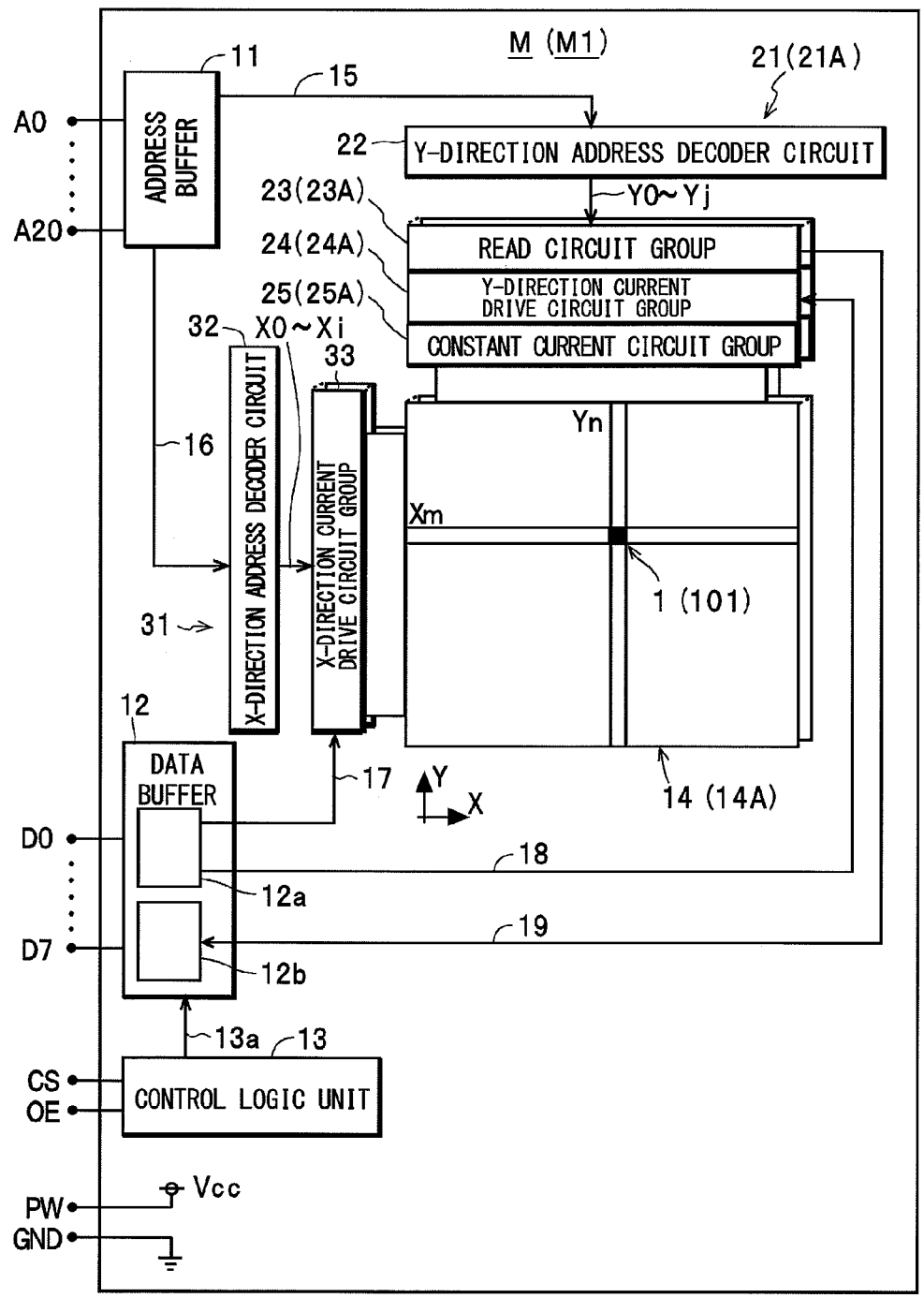
FIG. 1 is a block diagram showing the overall construction of a magnetic memory device M (M1).

As shown in FIG. 1, the magnetic memory device M includes an address buffer 11, a data buffer 12, a control logic unit 13, storage cell groups 14, a Y-direction driving control circuit unit 21, and an X-direction driving control circuit unit 31. Here, the Y-direction driving control circuit unit 21 includes a Y-direction address decoder circuit 22, read circuit groups 23, Y-direction current drive circuit groups 24, and constant current circuit groups 25. On the other hand, the X-direction driving control circuit unit 31 includes an X-direction address decoder circuit 32, and X-direction current drive circuit groups 33. In the magnetic memory device M, the number of the storage cell groups 14, the read circuit groups 23, the Y-direction current drive circuit groups 24, the constant current circuit groups 25, and the X-direction current drive circuit groups 33 is respectively equal to the number of bits (as one example, eight in the present embodiment) in the data (i.e., the data inputted via the data buffer 12). When predetermined data is stored at a predetermined address specified by an address inputted via the address buffer 11, the information ("1" or "0") of each bit that constructs the predetermined data is stored in a storage cell 1 with that predetermined address in the storage cell group 14 corresponding to that bit. The respective component elements included in the magnetic memory device M are driven by a DC voltage Vcc supplied from a DC voltage supply between a power supply terminal PW and a ground terminal GND.

The address buffer 11 includes external address input terminals A0 to A20, outputs address signals inputted from the external address input terminals A0 to A20 (for example, higher-order address signals out of the inputted address signals) to the Y-direction address decoder circuit 22 via a Y-direction address bus 15 and outputs address signals (for example, lower-order address signals out of the inputted address signals) to the X-direction address decoder circuit 32 via an X-direction address bus 16.

The data buffer 12 includes external data terminals D0 to D7, an input buffer 12a, and an output buffer 12b. The data buffer 12 is connected to the control logic unit 13 via a control signal line 13a. Here, the input buffer 12a is connected to each X-direction current drive circuit group 33 via an X-direction write data bus 17 and is connected to each Y-direction current drive circuit group 24 via a Y-direction write data bus 18 and outputs the information of the respective bits included in the data inputted via the external data terminals D0 to D7 to the X-direction current drive circuit groups 33 and the Y-direction current drive circuit groups 24 corresponding to the respective bits so that the information is stored in the storage cell groups 14 that correspond to the information of the respective bits in the eight storage cell groups 14. On the other hand, the output buffer 12b is connected to the read circuit groups 23 via a Y-direction read data bus 19. The output buffer 12b inputs data read via the read circuit groups 23 via the Y-direction read data bus 19 and outputs the inputted data to the external data terminals D0 to D7. The input buffer 12a and the output buffer 12b are driven in accordance with control signals inputted from the control logic unit 13 via the control signal line 13a.

The control logic unit 13 includes an input terminal CS and an input terminal OE and controls operations of the data buffer 12, the read circuit groups 23, the Y-direction current drive circuit groups 24, and the X-direction current drive circuit groups 33. More specifically, the control logic unit 13 determines whether any of the input buffer 12a and the output buffer 12b is to be activated based on a chip select signal inputted via the input terminal CS and an output enable signal inputted via the input terminal OE, generates control signals for operating the input buffer 12a and the output buffer 12b in accordance with such determination, and outputs the control signals via the control signal line 13a to the data buffer 12.

The respective storage cell groups 14 are composed of a plurality (j+1, where j is an integer of one or greater) of write bit lines (not shown) that are disposed in the X direction in FIG. 1 and are constructed of pairs of lines disposed in parallel, a plurality (i+1, where i is an integer of one or greater) of write word lines (also not shown) that are disposed in the Y direction in FIG. 1 so as to intersect (i.e., be perpendicular to) the lines of the respective write bit lines, a plurality (=(i+1)× (j+1))) of storage cells 1 (magnetic storage cells) laid out in two dimensions by disposing the storage cells at the intersections of the write bit lines and the write word lines (one example of a matrix-like layout with (i+1) rows and (j+1) columns), a plurality (j+1) of read bit lines 5 (see FIG. 2) that are respectively composed of a pair of lines 5a, 5b disposed in parallel and are themselves disposed in parallel with the respective write bit lines, and a plurality (i+1) of read word lines (in this embodiment, the word decode lines X0 to Xi are also used as read word lines) that are disposed in parallel with the respective write word lines.

Figure 2:
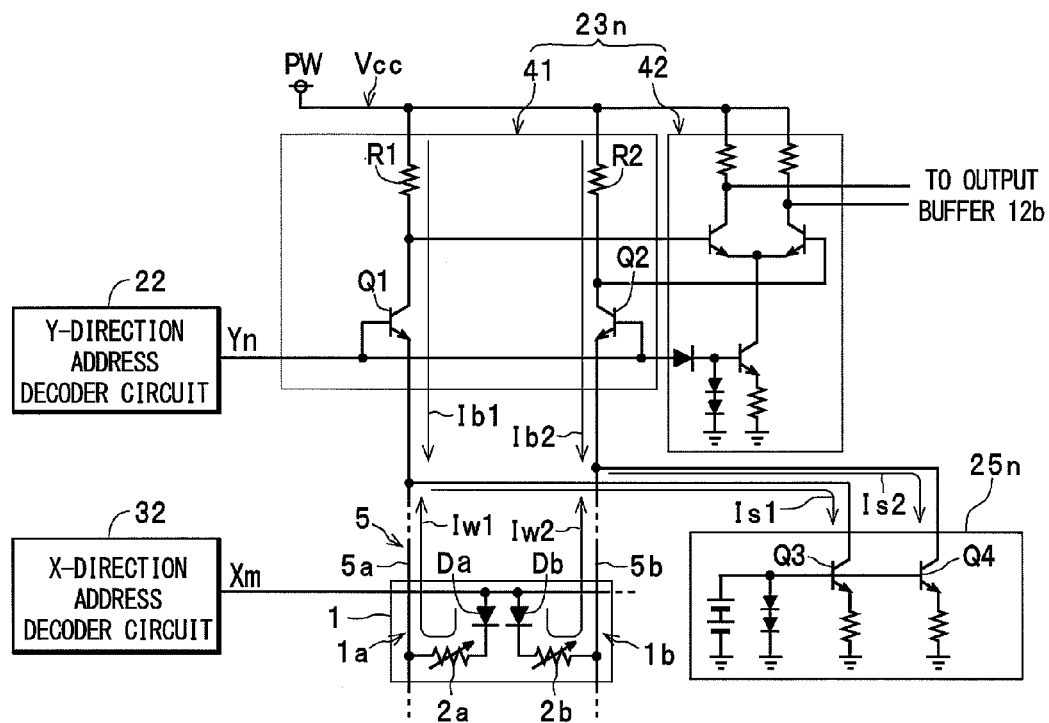
FIG. 2 is a circuit diagram showing the constructions of a storage cell 1, a read circuit (as one example, a read circuit 23n) included in a read circuit group 23, and a constant current circuit (as one example, a constant current circuit 25n) included in a constant current circuit group 25 of the magnetic memory device M.

As shown in FIG. 2, each storage cell 1 is constructed of a pair of storage elements 1a, 1b. *The storage elements 1a, 1b* include magnetoresistive effect revealing bodies 2a, 2b that are constructed using GMR (Giant Magneto-Resistive) or TMR (Tunneling Magneto-Resistive) structures and two unidirectional elements (as one example, diodes Da, Db) that are respectively connected in series to the magnetoresistive effect revealing bodies 2a, 2b. The storage elements 1a, 1b store information of bits that construct the data by changing to one of a state where the resistance of the magnetoresistive effect revealing body 2a is lower than the resistance of the magnetoresistive effect revealing body 2b and a state where the resistance of the magnetoresistive effect revealing body 2a is higher than the resistance of the magnetoresistive effect revealing body 2b in accordance with the direction of the synthetic magnetic field generated by a current supplied to the write bit line and the write word line. Here, the respective anode terminals of the diodes Da, Db are both connected to a word decode line Xm (where m is a value from 0 to i). The cathode terminal of the diode Da is connected via one of the magnetoresistive effect revealing bodies (the magnetoresistive effect revealing body 2a) to one line 5a out of the read bit lines 5 and the cathode terminal of the diode Db is connected via the other out of the magnetoresistive effect revealing bodies (the magnetoresistive effect revealing body 2b) to the other line 5b out of the read bit lines 5. Note that since the diodes Da, Db only need to regulate the direction of the currents (currents Iw1, Iw2 described later) flowing through the magnetoresistive effect revealing bodies 2a, 2b to a direction from the word decode line Xm toward the lines 5a, 5b, it is also possible to use a construction where the positions of the magnetoresistive effect revealing body 2a and the diode Da are interchanged, the positions of the magnetoresistive effect revealing body 2b and the diode Db are interchanged, and the magnetoresistive effect revealing bodies 2a, 2b are connected to the word decode line Xm.

Based on address signals inputted via the Y-direction address bus 15, the Y-direction address decoder circuit 22 of the Y-direction driving control circuit unit 21 selects one line (i.e., the bit decode line Yn, where n is an integer from 0 to j, inclusive) out of the (j+1) bit decode lines Y0, . . . Yn, . . . , Yj that are respectively connected to the (j+1) read circuits included in the read circuit groups 23 and to the (j+1) Y-direction current drive circuits included in the Y-direction current drive circuit groups 24 and applies a predetermined voltage to the selected bit decode line Yn. Here, a read circuit 23n (see FIG. 2) connected to the bit decode line Yn that has been selected out of the (j+1) read circuits included in each read circuit group 23 operates when the predetermined voltage described above is applied via the bit decode line Yn. Similarly, a Y-direction current drive circuit connected to the bit decode line Yn that has been selected out of the (j+1) Y-direction current drive circuits included in each Y-direction current drive circuit group 24 operates when the predetermined voltage described above is applied via the bit decode line Yn and supplies a write current to the write bit line 5 connected thereto.

On the other hand, based on address signals inputted via the X-direction address bus 16, the X-direction address decoder circuit 32 of the X-direction driving control circuit unit 31 selects one line (i.e., the word decode line Xm, where m is an integer from 0 to i, inclusive) out of the (i+1) word decode lines X0, ... Xm, ..., Xi that are respectively connected to the (i+1) X-direction current drive circuits included in each X-direction current drive circuit group 33 and applies a predetermined voltage to the selected word decode line Xm. Here, an X-direction current drive circuit connected to the word decode line Xm that has been selected out of the (i+1) X-direction current drive circuits included in each X-direction current drive circuit group 33 operates when the predetermined voltage described above is applied via the word decode line Xm and supplies a write current to the connected write word line. The (i+1) word decode lines X0 to Xi are respectively connected to (j+1) storage cells 1 included in the 0th to ith rows of each storage cell group 14 as a read word line. By doing so, a predetermined voltage is applied from the X-direction address decoder circuit 32 that functions as a DC voltage supply to the (j+1) storage cells 1 included in the mth row connected to the selected word decode line Xm. As a result, as shown in FIG. 2, the storage elements 1a, 1b are supplied from the X-direction address decoder circuit 32 with currents Iw1, Iw2 ("second currents" for the present invention) that are in proportion to the resistances of the storage elements 1a, 1b.

As shown in FIG. 2, each read circuit (hereinafter, the read circuit 23n is described as a representative example) includes a first stage circuit 41 (a "first current supplying circuit" for the present invention) and a second stage circuit 42 (a "differential amplifier circuit" for the present invention) and is constructed so as to be capable of reading information from a storage cell 1 by supplying currents ("first currents" for the present invention) Ib1, Ib2 to lines 5a, 5b out of the read bit lines 5 connected to (i+1) storage cells 1 included in the nth column out of the storage cell group 14 and then detecting the difference between the currents Ib1, Ib2. More specifically, the first stage circuit 41 includes two resistors R1, R2 ("detection resistors" for the present invention) for converting current to voltage that each have one end connected to the power supply terminal PW, and two switch elements (as one example, NPN transistors) Q1, Q2 whose collector terminals are respectively connected to the other ends of the resistors R1, R2 and whose emitter terminals are respectively connected to a corresponding line out of the lines 5a, 5b. When operating, the first stage circuit 41 supplies the currents Ib1, Ib2 to the lines 5a, 5b. Here, the resistances of the resistors R1, R2 are equal and are set sufficiently high compared to the resistances of the magnetoresistive effect revealing bodies 2a, 2b in their high-resistance state, described later (at least double the resistance, and in this example, ten times the resistance). As shown in FIG. 2, the second stage circuit 42 is constructed as a differential amplifier circuit, detects the difference between the currents Ib1, Ib2 and in more detail, the voltage difference between the voltages (the "detection voltages") across both ends of the resistors R1, R2 caused by the currents Ib1, Ib2, and amplifies and outputs the difference. The first stage circuit 41 and the second stage circuit 42 of the read circuit 23n respectively operate when a predetermined voltage is supplied from the bit decode line Yn selected by the Y-direction address decoder circuit 22 and cause the read circuit 23n to switch to an operating state.

As shown in FIG. 2, the constant current circuit (a "current control circuit" for the present invention, described here with the constant current circuit 25n as one example) includes a pair of transistors Q3, Q4 whose collector terminals are respectively connected to the lines 5a, 5b which are connected in turn to the read circuit 23n and are constructed so as to always draw constant currents Is1, Is2 that are equal due to a base current of the same value (i.e., a constant current) always being supplied. Here, as shown in FIG. 2, the current Is1 flowing to the transistor Q3 is the total of the current Ib1 supplied to one of the lines (the line 5a) out of the read bit lines 5 via the switch element Q1 of the first stage circuit 41 in the read circuit group 23 connected to the selected bit decode line Yn and a current Iw1 supplied to one of the lines (the line 5a) out of the read bit lines 5 via the diode Da and the storage element 1a of the storage cell 1 connected to the selected word decode line Xm. In the same way, the current Is2 flowing to the transistor Q4 is the total of the current Ib2 supplied to the other line (the line 5b) out of the read bit lines 5 via the switch element Q2 of the first stage circuit 41 and a current Iw2 supplied to the other line (the line 5b) out of the read bit lines 5 via the diode Db and the storage element 1b of the storage cell 1. With this construction, the constant current circuit 25n controls the total current (i.e., the total) of the current Ib1 and the current Iw1 so as to be constant and also controls the total current (i.e., the total) of the current Ib2 and the current Iw2 so as to be constant. Accordingly, in each storage cell group 14, the first stage circuit 41 of the read circuit 23n that supplies the currents Ib1, Ib2 to the respective lines 5a, 5b of the read bit lines 5 and the storage cell 1 that supplies the currents Iw1, Iw2 to the respective lines 5a, 5b of the read bit lines 5 are connected in parallel to the constant current circuit 25n.

Next, a read operation for information in the magnetic memory device M will be described. Note that for the magnetic memory device M, it is assumed that information has been stored in advance by respectively operating the Y-direction current drive circuit groups 24 and the X-direction current drive circuit groups 33.

First, the address buffer 11 outputs address signals inputted via the external address input terminals A0 to A20 to the X-direction address decoder circuit 32 and the Y-direction address decoder circuit 22 via the X-direction address bus 16 and the Y-direction address bus 15. At this point, the Y-direction address decoder circuit 22 selects one out of the bit decode lines Y0 to Yj (as one example, the bit decode line Yn) based on the inputted address signals. In the same way, the X-direction address decoder circuit 32 selects one out of the word decode lines X0 to Xi (as one example, the word decode line Xm) based on the inputted address signals. On the other hand, in the data buffer 12, the output buffer 12b switches to an operating state and the input buffer 12a switches to a non-operating state in accordance with control signals outputted from the control signal line 13a.

Here, in the read circuit 23n of the storage cell group 14 selected by the bit decode line Yn, by having a predetermined voltage applied via the bit decode line Yn, the first stage circuit 41 and the second stage circuit 42 switch to an operating state. At this time, as shown in FIG. 2, the first stage circuit 41 starts to supply the currents Ib1, Ib2 to the lines 5a, 5b of the read bit line 5 connected to the (i+1) storage cells 1 included in the nth column of the storage cell group 14. On the other hand, a predetermined voltage is applied from the word decode line Xm to the (j+1) storage cells 1 included in the mth row connected to the selected word decode line Xm in the storage cell group 14. By doing so, as shown in FIG. 2, the supplying of the currents Iw1, Iw2 from the word decode line Xm to the storage elements 1a, 1b commences. Here, depending on the information of the bit stored in the storage cell 1, out of the magnetoresistive effect revealing bodies 2a, 2b included in the storage elements 1a, 1b that construct the storage cell 1 positioned in the mth row and the nth column of the storage cell group 14, one magnetoresistive effect revealing body will be in a high resistance state and the other magnetoresistive effect revealing body will be in a low resistance state. This means that the values of the currents Iw1, Iw2 flowing through the storage elements 1a, 1b will be inversely proportional to the resistances of the magnetoresistive effect revealing bodies 2a, 2b. As one example, when the magnetoresistive effect revealing body 2a included in the storage element 1a is in the high resistance state and the magnetoresistive effect revealing body 2b included in the storage element 1b is in the low resistance state, the value of the current Iw1 will be lower than the value of the current Iw2. Here, since the current Is1 that is the total of the current Ib1 and the current Iw1 and the current Is2 that is the total of the current Ib2 and the current Iw2 are controlled by the constant current circuit 25n so as to be constant, the values of the currents Ib1, Ib2 are given by subtracting the currents Iw1, Iw2 from the currents Is1, Is2 that are both equal and constant.

The second stage circuit 42 of each read circuit 23n detects the difference in voltage between the voltages produced across both ends of the resistors R1, R2 based on the currents Ib1, Ib2 (i.e., the difference between the currents Ib1, Ib2, or in other words, the difference between the values of the currents Iw1, Iw2) to obtain the information (i.e., binary information) stored in the storage cell 1 and outputs the information to the Y-direction read data bus 19. Here, the resistance values of the resistors R1, R2 are set at least double the resistance values of the magnetoresistive effect revealing bodies 2a, 2b in the high resistance state. This means that the difference in the values of the currents Iw1, Iw2 due to the relative magnitudes of the resistances of the magnetoresistive effect revealing bodies 2a, 2b is amplified by the first stage circuit 41 as a difference between the voltages generated across both ends of the resistors R1, R2 and is outputted to the second stage circuit 42. Next, the output buffer 12b outputs the data inputted via the Y-direction read data bus 19 to the external data terminals D0 to D7. By doing so, the reading of the data stored in the storage cell 1 is completed.

By doing so, according to the magnetic memory device M, two magnetoresistive effect revealing bodies 2a, 2b are disposed inside each storage cell 1, the first stage circuit 41 of each read circuit included in the read circuit group 23 supplies the currents Ib1, Ib2 for detecting the resistances of the magnetoresistive effect revealing bodies 2a, 2b included in a storage cell 1, the X-direction address decoder circuit 32 supplies the currents Iw1, Iw2 to the magnetoresistive effect revealing bodies 2a, 2b, and a constant current circuit of the constant current circuit group 25 carries out control so that the total of the current Ib1 and the current Iw1 (i.e., the value of the current Is1) and the total of the current Ib2 and the current Iw2 (i.e., the value of the current Is2) are equal and constant. By doing so, it is possible to achieve a construction where the first stage circuit 41 and the storage cells 1 are connected in parallel to the respective constant current circuits included in the constant current circuit group 25. This means that compared to a conventional construction where the read circuit, the storage cell, and the constant current circuit are connected in series between the DC voltage Vcc and ground, it is possible to lower the voltage required by a series circuit composed of the first stage circuit 41 and the constant current circuit by the voltage drop across the storage cell 1. Accordingly, since it is possible to supply currents Ib1, Ib2 of a sufficient magnitude to the lines 5a, 5b of a read bit line 5 even when the DC voltage Vcc is reduced, it is possible to reduce the power consumption while still being able to carry out stabilized read operations.

Also, since the information stored in each storage cell 1 is read by the second stage circuit 42 which operates based on the difference in the detection voltages converted by the resistors R1, R2, by setting the resistances of the resistors R1, R2 higher than the resistances of the magnetoresistive effect revealing bodies 2a, 2b, it is possible to sufficiently raise the sensitivity when reading information from a storage cell 1. When doing so, by setting the resistances of the resistors R1, R2 at least double the resistances of the magnetoresistive effect revealing bodies 2a, 2b, it is possible to significantly raise the sensitivity when reading information from a storage cell 1.

Note that the present invention is not limited to the construction described above. For example, although an example where the storage cell 1 is constructed of a pair of storage elements 1a, 1b has been described, a storage cell may be constructed of a single storage element. Such magnetic memory device can be realized based on the construction of the magnetic memory device M by replacing the circuits where two series of the same construction are provided with circuits including a single series of such constructions. A magnetic memory device M1 where each storage cell is constructed of a single storage element will now be described. Note that component elements that are the same as in the magnetic memory device M have been assigned the same reference numerals.

As shown in FIG. 1, the magnetic memory device M1 includes the address buffer 11, the data buffer 12, the control logic unit 13, storage cell groups 14A, a Y-direction driving control circuit unit 21A, and the X-direction driving control circuit unit 31. Here, the Y-direction driving control circuit unit 21A includes the Y-direction address decoder circuit 22, read circuit groups 23A, Y-direction current drive circuit groups 24A, and constant current circuit groups 25A. On the other hand, the X-direction driving control circuit unit 31 includes the X-direction address decoder circuit 32 and the X-direction current drive circuit groups 33. Like the magnetic memory device M, the number of the storage cell groups 14A, the read circuit groups 23A, the Y-direction current drive circuit groups 24A, the constant current circuit groups 25A, and the X-direction current drive circuit groups 33 included in the magnetic memory device M1 is respectively equal to the number of bits.

Figure 3:
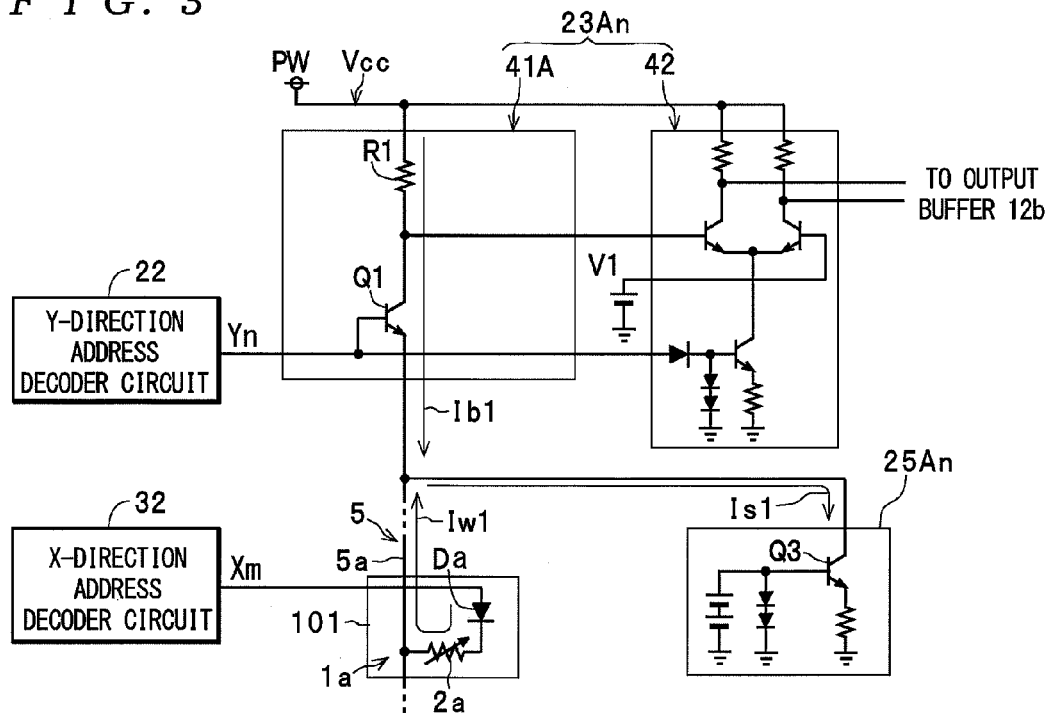
FIG. 3 is a circuit diagram showing the constructions of a storage cell 101, a read circuit (as one example, a read circuit 23An) included in a read circuit group 23A, and a constant current circuit (as one example, a constant current circuit 25An) included in a constant current circuit group 25A of a magnetic memory device M1.

As shown in FIG. 3, in the storage cell group 14A, the read bit lines 5 are each composed of one line 5a. Also as shown in FIG. 3, each storage cell 101 includes a single storage element 1a. Here, the storage element 1a is constructed of a single magnetoresistive effect revealing body 2a and a single unidirectional element (as one example, the diode Da) and by switching the resistance of the magnetoresistive effect revealing body 2a to one of a high resistance state and a low resistance state, information on each bit that constructs the data is stored.

Each Y-direction current drive circuit included in a Y-direction current drive circuit group 24A is constructed so as to supply current to one write bit line. As shown in FIG. 3, since the storage elements 1b and the lines 5b of the read bit lines 5 are not provided, in each read circuit (hereinafter, the read circuit 23An connected to the storage cells 101 in the nth column will be described as one example) included in a read circuit group 23A, the first stage circuit 41A is constructed of the resistor R1 and the switching element Q1. Although there is no change in the fundamental circuit construction of the second stage circuit 42, to make it possible to achieve a differential amplification operation with a one-series input (the detection voltage generated by the resistor R1), a predetermined voltage (reference voltage) V1 is supplied to the base terminal of the transistor that was connected to a collector terminal of the switching element Q2 of the first stage circuit 41 in the magnetic memory device M. Since the lines 5b are not provided in the read bit lines 5, as shown in FIG. 3, the transistor Q4 and the resistor connected to the emitter terminal thereof are omitted from the respective constant current circuits included in each constant current circuit group 25A and the constant current circuits are constructed of only the circuit including the transistor Q3 (in the following description, the constant current circuit 25An connected to the storage cells 101 in the nth column is given as an example).

With the magnetic memory device M1, write operations for information and read operations for information are carried out for each storage element 1a in the same way as the write operations and the read operations carried out on one of the storage elements (e.g., the storage element 1a) in the magnetic memory device M. Accordingly, in the same way as the magnetic memory device M, it is possible to use a construction where the first stage circuit 41A and the storage cell 101 are connected in parallel to each constant current circuit included in the constant current circuit group 25A. This means that compared to the conventional construction where the read circuit, the storage cell, and the constant current circuit are connected in series between the DC voltage Vcc and ground, it is possible to lower the voltage required by a series circuit composed of the first stage circuit 41A and the constant current circuit by the voltage drop across the storage cell 101. Accordingly, since it is possible to supply a current Ib1 of a sufficient magnitude to the line 5a of a read bit line 5 even when the DC voltage Vcc is reduced, it is possible to reduce the power consumption while still being able to carry out stabilized read operations.

The second stage circuit 42 operates based on a voltage difference between the detection voltage converted by the resistor R1 and the voltage V1 to read the information stored in each storage cell 101, and by setting the resistance of the resistor R1 higher than the resistance of the magnetoresistive effect revealing body 2a, it is possible to sufficiently raise the sensitivity when reading information from each storage cell 101. In addition, in the same way as the magnetic memory device M, by setting the resistance of the resistor R1 at least double the resistance of the magnetoresistive effect revealing body 2a, it is possible to significantly raise the sensitivity when reading information from the storage cells 101.

Although each read circuit and each constant current circuit described above is constructed using transistors, it is also possible to use FET (Field Effect Transistors) in place of the transistors.

INDUSTRIAL APPLICABILITY

As described above, according to the magnetic memory device according to the present invention, by including a first current supplying circuit that supplies a first current for detecting the resistance of a magnetoresistive effect revealing body, a second current supplying circuit that supplies a second current to the magnetoresistive effect revealing body, and a current control circuit that carries out control so that a total of the first current and the second current is constant, it is possible to achieve a construction where the first current supplying circuit and the storage cell (i.e., the magnetoresistive effect revealing body) are connected to the current control circuit in parallel. This means that compared to a conventional construction where the first current supplying circuit, the storage cell, and the current control circuit are connected in series between a DC voltage and ground, it is possible to lower the voltage required by a series circuit composed of the first current supplying circuit and the current control circuit by the voltage drop that occurs across the storage cell. Accordingly, it is possible to supply a first current of a sufficient magnitude even if the voltage is reduced. This means it is possible to realize a magnetic memory device with reduced power consumption that is still capable of stabilized read operations.

DESCRIPTION OF REFERENCE NUMERALS 1, 101 STORAGE CELL
2a, 2b MAGNETORESISTIVE EFFECT REVEALING BODY
Ib1, Ib2, Iw1, Iw2 CURRENT
25, 25A CONSTANT CURRENT CIRCUIT GROUP
32 X-DIRECTION ADDRESS DECODER CIRCUIT
41, 41A FIRST STAGE CIRCUIT
M, M1 MAGNETIC MEMORY DEVICE

The invention claimed is:

1. A magnetic memory device comprises a plurality of storage cells laid out in two dimensions in (i+1) rows and (j+1) columns (where i, j are integers of one or higher),
wherein one or two or more magnetoresistive effect revealing bodies are disposed in each of the storage cells, and the magnetic memory device further comprises:
a first current supplying circuit that supplies a first current for detecting a resistance of each magnetoresistive effect revealing body;
a second current supplying circuit that supplies a second current to each magnetoresistive effect revealing body; and
a current control circuit that carries out control so that a total of the first current and the second current is constant.

2. A magnetic memory device according to claim 1,
wherein two magnetoresistive effect revealing bodies are disposed in each of the storage cells,
one current control circuit is connected to both magnetoresistive effect revealing bodies in each storage cell,
the first current supplying circuit includes two detection resistors that convert first currents to detection voltages,
the second current supplying circuit supplies second currents to both magnetoresistive effect revealing bodies, and
each current control circuit carries out control so that each total produced by adding a first current flowing through a detection resistor and a second current flowing through a magnetoresistive effect revealing body is constant.

3. A magnetic memory device according to claim 2,
further comprising a differential amplifier circuit that operates based on a voltage difference between the detection voltages converted by the respective detection resistors to read information stored in each storage cell.

4. A magnetic memory device according to claim 1,
wherein one magnetoresistive effect revealing body is disposed in each of the storage cells,
the current control circuit is connected to the magnetoresistive effect revealing body in each storage cell, the first current supplying circuit includes a detection resistor that converts the first current to a detection voltage, and the second current supplying circuit supplies the second current to the magnetoresistive effect revealing body.

5. A magnetic memory device according to claim 4, further comprising a differential amplifier circuit that operates based on a voltage difference between the detection voltage converted by the detection resistor and a reference voltage to read information stored in each storage cell.

6. A magnetic memory device according to claim 2, wherein a resistance of the detection resistor is set at least double a resistance of each magnetoresistive effect revealing body.

7. A magnetic memory device according to claim 3, wherein a resistance of the detection resistor is set at least double a resistance of each magnetoresistive effect revealing body.

8. A magnetic memory device according to claim 4, wherein a resistance of the detection resistor is set at least double a resistance of each magnetoresistive effect revealing body.

9. A magnetic memory device according to claim 5, wherein a resistance of the detection resistor is set at least double a resistance of each magnetoresistive effect revealing body.

* * * * *

UNITED STATES PATENT AND TRADEMARK OFFICE
CERTIFICATE OF CORRECTION

| | |
|---|---|
| PATENT NO. | : 7,808,813 B2 |
| APPLICATION NO. | : 11/721141 |
| DATED | : October 5, 2010 |
| INVENTOR(S) | : J. Ezaki et al. |

Page 1 of 1

It is certified that error appears in the above-identified patent and that said Letters Patent is hereby corrected as shown below:

At column 13, line 13 (claim 6, line 2) of the printed patent, --at-- should be inserted before "least".

At column 14, line 2 (claim 7, line 2) of the printed patent, --at-- should be inserted before "least".

At column 14, line 6 (claim 8, line 2) of the printed patent, --at-- should be inserted before "least".

At column 14, line 10 (claim 9, line 2) of the printed patent, --at-- should be inserted before "least".

Signed and Sealed this
Tenth Day of May, 2011

David J. Kappos
*Director of the United States Patent and Trademark Office*